United States Patent [19]

Lehmann et al.

[11] 4,241,380

[45] Dec. 23, 1980

[54] HOUSING FOR AN ELECTRIC CIRCUIT ARRANGEMENT

[75] Inventors: Kjeld Lehmann, Sonderborg; Arne V. R. Rasmussen, Nordborg, both of Denmark

[73] Assignee: Danfoss A/S, Nordborg, Denmark

[21] Appl. No.: 18,247

[22] Filed: Mar. 7, 1979

Related U.S. Application Data

[63] Continuation of Ser. No. 884,997, Mar. 9, 1978, abandoned.

[30] Foreign Application Priority Data

Mar. 10, 1977 [DE] Fed. Rep. of Germany ....... 2710432

[51] Int. Cl.³ ............................................. H05K 7/20
[52] U.S. Cl. ................................... 361/383; 361/386
[58] Field of Search ............... 98/58, 60; 165/59, 80; 174/16 R, 16 HS; 361/380–384, 386, 388

[56] References Cited

U.S. PATENT DOCUMENTS

| 3,264,526 | 8/1966 | Wiggerman | 361/381 |
| 3,371,975 | 3/1968 | Meltzer | 361/384 |
| 3,407,869 | 10/1968 | Staunton | 361/383 |
| 3,462,553 | 8/1969 | Spranger | 361/383 |
| 3,771,023 | 11/1973 | Hallingsend | 361/383 |
| 3,851,221 | 11/1974 | Beaulieu | 361/382 |
| 3,951,490 | 4/1976 | Devendorf | 361/380 |
| 4,047,242 | 9/1977 | Jakob | 361/388 |

Primary Examiner—Gerald P. Tolin
Attorney, Agent, or Firm—Wayne B. Easton

[57] ABSTRACT

The invention relates to a housing assembly for electrical equipment which provides for the efficient removal of heat produced by high heat producing electrical components. A perimeter wall has the usual external cooling fins. A divider wall arrangement for forming two or more enclosed spaces provides vertically extending flue passages to create a chimney effect. The divider wall arrangement allows components to be mounted on both sides thereof.

4 Claims, 4 Drawing Figures

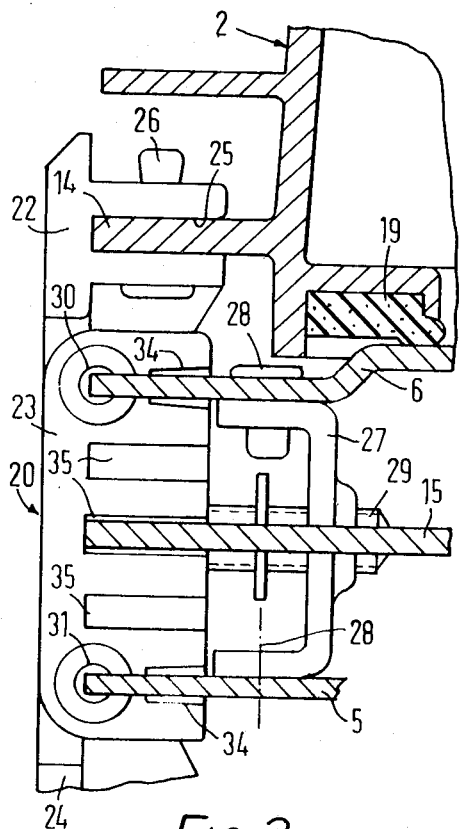
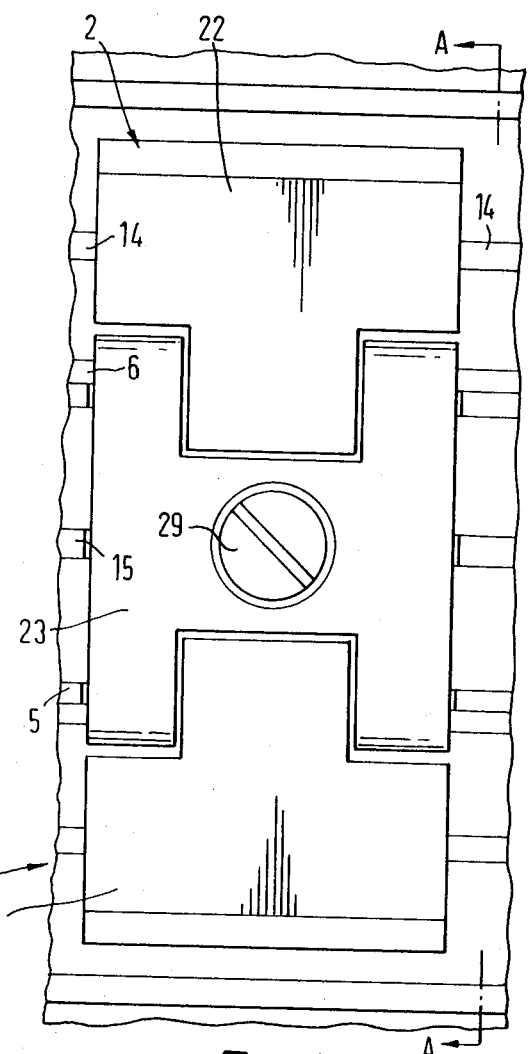
FIG.3
FIG.4

HOUSING FOR AN ELECTRIC CIRCUIT ARRANGEMENT

This is a continuation Pat. Application of Ser. No. 884,997 filed Mar. 9, 1978, now abandoned.

The invention relates to a housing arranged in a cooling medium such as air for an electric circuit arrangement of components having high and low heat losses, comprising two housing spaces insulated from each other by a thermal barrier, the components of high loss being installable in the one housing space and the components of low loss in the other housing space.

In a known housing of this kind, the two housing spaces cooled on the outside by surrounding air are separated by a wall of insulating material. The components of high loss, such as dry rectifiers, are mounted on one wall and are cooled by a fan which is disposed in the same space and sucks in fresh air through apertures in the upper portion of the housing and discharges the heated air through apertures in the lower portion of the housing. The components having a lower loss are secured at a spacing from the wall of insulating material on a mounting wall in a closed space of the housing.

Since cooling of the components of high loss is not sufficient by the surrounding air sweeping along the walls, the associated housing space requires a forced draught by means of a fan built into the spaces. This housing space therefore becomes comparatively large. The fan motor also constitutes an additional heat source increasing the cooling requirements of the space.

The invention is based on the problem of providing a housing of the aforementioned kind which ensures adequate cooling of all components within the housing spaces without forced cooling.

According to the invention, this problem is solved in that the barrier comprises two thermally conductive walls bounding between them a chamber which can be traversed by the coolant.

With this construction of the housing, the chamber between the bounding walls constitutes an additional channel for coolant. The heat loss can therefore be dissipated not only through the side walls of the housing but also through the bounding walls. Each of the two housing spaces is therefore impinged by coolant on all four sides. It has been found that in this way adequate heat dissipation is possible merely by external cooling of the space containing the components of high loss. The heat transfer from the inside to the outside is enhanced in that the last-mentioned housing space can be kept comparatively small because it need not accommodate a fan. The chamber between the bounding walls traversed by the coolant also functions as a thermal insulator. A wall of insulating material can therefore be dispensed with.

Preferably, it is ensured that the chamber between the bounding walls opens to atmosphere at the top and bottom. In this way one obtains very simple but intensive air cooling. By reason of heating of the air in the intermediate space by the bounding walls one obtains a chimney effect in the intermediate space by which the heated air is discharged at the top of the intermediate space and cold air is sucked in at the bottom. In this way one dispenses with a fan or the like for maintaining a flow of coolant in the intermediate space.

It is also favourable if at least one bounding wall serves as a mounting wall for one part of the components.

In this way the bounding walls serve an additional function. In addition, the components thus mounted can be more efficiently cooled. Stronger heating of the bounding walls intensifies the chimney effect. It is therefore particularly recommended that at least some components of high loss are in thermally conductive contact with one of the bounding walls.

Further, it is favourable if the outer walls of the housing spaces have cooling ribs. In this way the lost heat transmitted to the outer walls is dissipated more rapidly to the surroundings.

It is particularly advantageous if the bounding walls comprise vertically extending juxtaposed recesses subdividing the intermediate space into several channels. In this way one obtains an increase in the surface area of the bounding walls so that they can more readily dissipate the heat to the intermediate space. At the same time the flow of coolant in the intermediate space is also sub-divided into a plurality of streams, thereby counteracting the formation of eddy currents in the flow of coolant that could result in heating of the cooler bounding wall on the sides of the components of low loss by the coolant heated on the hotter bounding wall. In addition, these recesses increase the mechanical strength of the bounding walls.

Preferably, a planar plate is disposed between the bounding walls. This effects further separation of the differently heated layers of coolant by reason of forming a flow of coolant that is as laminar as possible. If it is made of heat conductive material, it also helps to increase the surface area of the bounding walls. At the same time the heat is more rapidly dissipated from those regions at which the bounding walls are nearest to one another.

The bounding walls with recesses can be clamped between two outer housing portions which bound the outside of the housing spaces. This also results in laterally open air inlet slots through which the surrounding air can penetrate into the intermediate space around the recesses. This leads to still better cooling in comparison with a construction in which the air can enter the intermediate space only at the underside of the housing.

In addition, the depth of the recesses can be selected to be substantially equal to the pitch of the cooling ribs and the periphery of the bounding walls and intermediate plate can be selected to correspond to the periphery of the outer housing portions in the plane of the bounding walls or intermediate plate, respectively. This has the advantage that the outer edges of the bounding walls and the intermediate plate also function as cooling ribs.

In addition, the confronting rims of the outer housing portions should be thermally insulated from each other. This prevents heat transfer between the two housing portions by thermal conduction. Altogether, one obtains better thermal insulation of the two housing spaces and thus of the components of low loss as compared with the components of high heat loss.

This thermal insulation of the rims of the housing portions may comprise a peripheral elastic seal, preferably of rubber, elastic foam or the like. This construction of the thermal insulation also prevents the entry of dust and/or humidity to the housing spaces between the housing portions and the rims of the bounding walls.

The two outer housing portions can be pressed against the bounding walls by clamps which interconnect same. These ensure an adequate interconnection of the housing and nevertheless permit easy opening of the housing portions, for example to prevent a build-up of heat during overloading.

A particularly simple manner of applying the clamps can be that they are placed over cooling ribs of the outer housing portions. In this way the cooling ribs simultaneously have the function of closure or connecting parts.

Further, one or more clamps can be formed as a closure spring and the other clamps as hinges pivotally interconnecting the outer housing portions and the bounding walls. In this way it is sufficient merely to release the closure spring or springs to open one or the other housing portion or both, because the housing portions are pivotally connected to each other as well as to the bounding walls. This has the advantage that access to the bounding walls is unobstructed.

In this case it is also of advantage for the or each hinge to comprise a central portion which can be placed over the rims of the bounding walls, connected to the intermediate plate by a screw and have pivoted thereto outer portions which can each be connected to a respective one of the outer housing portions. This construction permits easy replacement of the insert unit consisting of the interconnected bounding walls and the intermediate plate as well as the components secured thereto.

The invention and its developments will now be described in more detail with reference to a preferred example shown in a diagrammatic drawing, wherein:

FIG. 3 is an enlarged detail of FIG. 1, and

FIG. 4 is the side elevation of the FIG. 3 detail.

Figure 1:
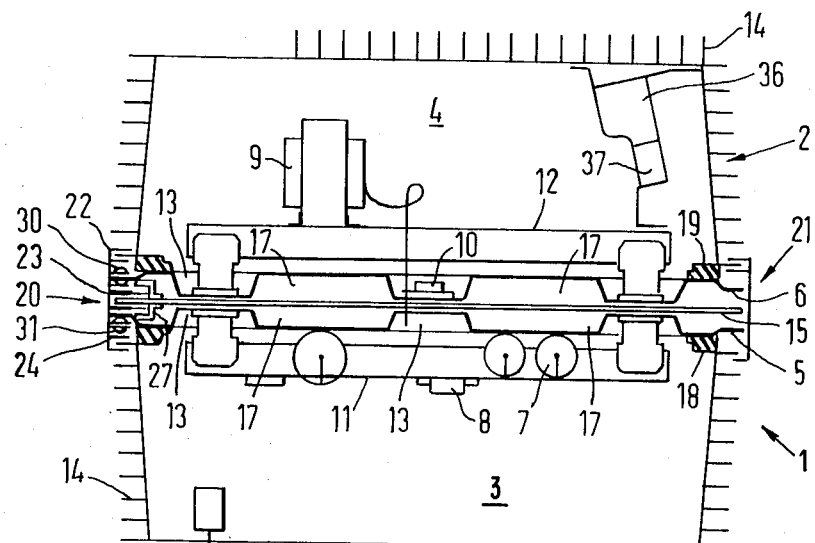
FIG. 1 is the horizontal cross-section A—A of the closed housing with built-in parts.

According to FIG. 1, the housing comprises two substantially identical dished outer housing portions 1 and 2 of metal. The front housing portion 1 bounds a space 3 and the rear housing portion 2 bounds a space 4 at the outside. On the inside the two housing spaces 3 and 4 are separated by two bounding walls 5 and 6 of metal. The housing space 3 serves to receive components of low heat loss, e.g. condensers 7 or high-ohmic resistors 8 of a control portion of an electric circuit arrangement and the housing space 4 serves to receive components of high heat loss of a power portion of the circuit arrangement, e.g. a transformer 9 or power thyristors 10. The components 7, 8 of low loss are secured on a printed circuit plate 11 near or in contact with the bounding wall 5, the plate being connected to the bounding wall 5 by metallic connecting members. The components 9 and 10 are likewise secured on a printed circuit plate 12 near or directly on the bounding wall 6, the plate being connected to the bounding wall 6 by metallic connecting members.

The bounding walls 5 and 6 have recesses 13 and are so arranged that the bases of the recesses 13 face one another. The depth of the recesses 13 is substantially equal to the pitch (spacing) of cooling ribs 14 provided on the outside of the housing portions 1 and 2. A planar plate 15 of metal is disposed between the bounding walls 5 and 6. The bounding walls 5 and 6 and the intermediate plate 15 are connected near the recesses 13, e.g. riveted or welded. The bases of the recesses 13 and the intermediate plate 15 are provided with throughgoing elongate holes 16 which are substantially closed by power components such as the power thyristor 10. They permit the passage of connections and conduits to one or the other side of the bounding walls 5 and 6.

Figure 2:
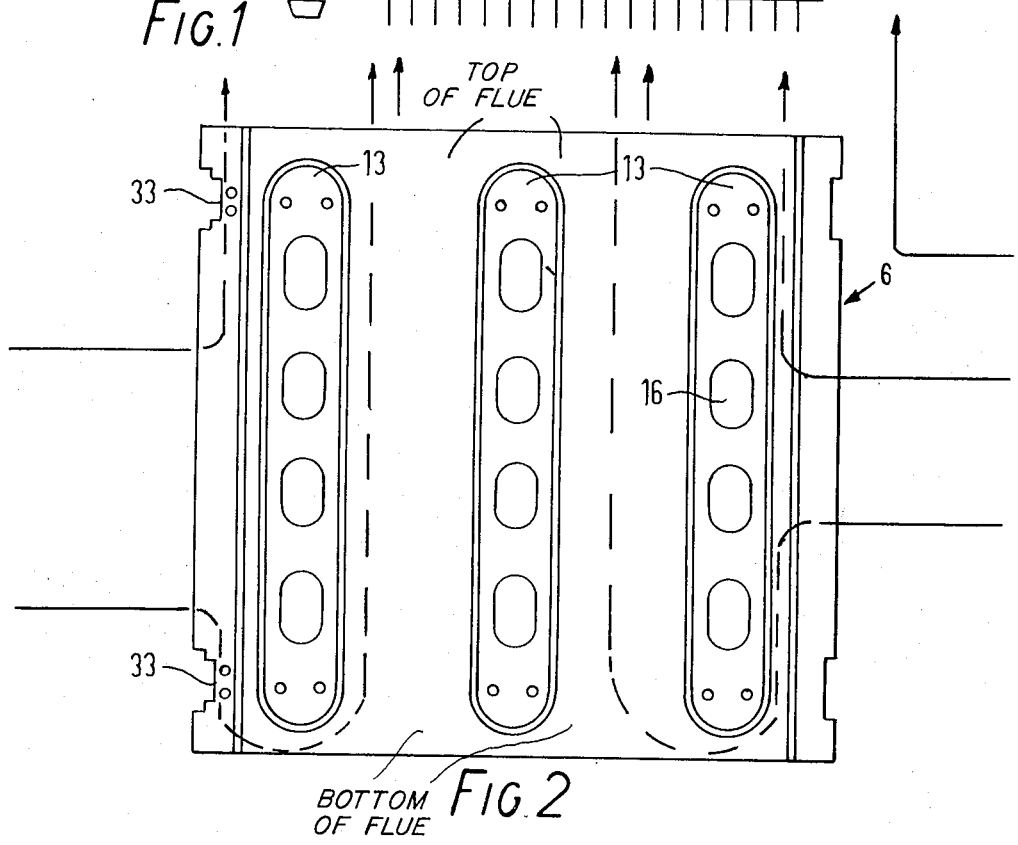
FIG. 2 is a side elevation of the one bounding wall.

The recesses 13 form an intermediate space which is sub-divided by a plurality of vertical passages 17 and which opens to the atmosphere at the top, bottom as well as the sides. The lateral connection to the atmosphere is produced around the upper and lower rims of the recesses 13 because the recesses 13 terminate in front of the upper and lower rims of the bounding walls 5 and 6, see especially FIG. 2.

Peripheral elastic seals 18 and 19, for example of rubber or plastics foam, are inserted at the rims of the housing portions 1 and 2 to lie against the bounding walls 5 and 6.

The housing portions 1 and 2 are held together by clamps 20 and 21 of plastics formed on the one hand as a hinge 20 and on the other hand as a closure spring 21.

FIGS. 3 and 4 show an enlarged detail of the housing with a hinge 20. A hinge 20, of which two are provided, consists of a central portion 23 and two outer portions 22 and 24 hinged thereto. The outer portions 22 and 24 have a vertical throughgoing slot 25 which fits on a cooling rib 14 and they are secured to cooling ribs 24 by means of screws or rivets 26. The bounding walls 5 and 6 are also connected by U-shaped yoke 27 which passes through a recess in the intermediate plate 15 and is secured by its limbs to the bounding walls 5 and 6, for example by screws or rivets 28. A headed screw 29 of which the head is countersunk in the central portion 23 passes through the central portion 23 of the hinge 20 and the plate 15 in the plane thereof and is screwed into a tapped hole in the web of the yoke 27. The web of the yoke 27 engages behind shoulders of the recess in the plate 15 so that the yoke 27 is not displaceable in the plane of the plate 15. The hinge portions 22, 23 and 24 are connected by two pivot pins 30 and 31. The bounding walls 5 and 6 likewise have recesses 32 and 33 with which, in the same way as the intermediate plate 15, they engage in lateral blind slots 34 or 35 of the central portion 23. At the same time, recesses 32 and 33 (see FIG. 2) of the bounding walls 5 and 6 secure the pivot pins 30 and 31 against axial displacement.

The heat of the components 7, 8, 9 and 10 developed during operation is transmitted by convection partly to the outer housing portions 1 and 2 and through these to the surrounding air but for the most part also to the bounding walls 5 and 6 because of their immediate vicinity thereto and because of the large surface areas of the bounding walls. A considerable proportion of the heat loss is also conducted directly to the bounding walls 5 and 6. The heating of the housing walls 5 and 6 produced thereby leads to heating of the air in the intermediate space formed by the channels 17 and thus to a chimney effect in the intermediate space.

In this way the heated air in the channels 17 is discharged more rapidly and replaced by cooler air. The intermediate plate 15 on the one hand ensures an enlargement of the surface area of the metal walls 5 and 6 and on the other hand forms a substantially laminar air flow in the channels 17 so that the warmer air layers on the sides of the bounding wall 6 are not mixed with the cooler air layers on the sides of the bounding wall 5 but both heat sources (the stronger in the housing space 4 and the weaker in the housing space 3) nevertheless contribute to the thermal rise in the channels 17. If overheating should nevertheless occur in one or both housing spaces, e.g. as a result of a short circuit, it is merely necessary to pull off the plastics closure springs 21 in the form of clamps and to pivot the housing portion 1 and/or 2 about the pivots of the hinges 20 to one side so as to open the housing, this possibly also separating the inter-plugged parts 36 and 37 (FIG. 1) of a multipole conductor coupling. If desired, the entire built-in unit consisting of the connected mounting walls and the components that are directly or indirectly secured thereto can then be exchanged by simply loosening the screws 29.

Modifications of the illustrated example fall within the scope of the invention. Thus, the bounding walls could also be planar at a spacing from one another. If desired, the intermediate plate can be omitted. Only one hinge may be used instead of two hinges 20.

Similarly, it may be sufficient to have only one closure spring. The components giving rise to heat losses can all be mounted directly on the bounding walls. The channels 17 may be constructed for insertion in the coolant circuit of a refrigerating unit.

We claim:

1. A housing assembly for electrical equipment comprising, external wall means laterally defining an enclosed space, intermediate wall means of a thermally conductive material attached to said external wall means and dividing said enclosed space into at least two laterally enclosed compartments with substantially no lateral fluid communication between any of said compartments, said intermediate wall means forming flue means between at least two of said compartments to provide a chimney effect to direct air upwardly which is warmer than atmospheric air, said flue means having the top and bottom thereof open to the atmosphere externally of said compartments, and said intermediate wall means having electrical components mounted on both sides thereof.

2. A housing assembly according to claim 1 wherein said electrical components include generally higher power components on one side of said intermediate wall means and generally lower power components on the other side of said intermediate wall means.

3. A housing assembly according to claim 1 wherein said intermediate wall means includes two walls having vertically extending juxtaposed recesses dividing and flue means into a plurality of discrete channels.

4. A housing assembly according to claim 3 wherein a planar plate is disposed between said two walls.

* * * * *